(12) United States Patent
Vladimirsky et al.

(10) Patent No.: US 12,523,941 B2
(45) Date of Patent: Jan. 13, 2026

(54) LITHOGRAPHIC PRE-ALIGNMENT IMAGING SENSOR WITH BUILD-IN COAXIAL ILLUMINATION

(71) Applicant: ASML Holding N.V., Veldhoven (NL)

(72) Inventors: Yuli Vladimirsky, Weston, CT (US); Lev Ryzhikov, Norwalk, CT (US)

(73) Assignee: ASML Holding N.V., Veldhoven (NL)

( * ) Notice: Subject to any disclaimer, the term of this patent is extended or adjusted under 35 U.S.C. 154(b) by 516 days.

(21) Appl. No.: 18/001,258

(22) PCT Filed: May 20, 2021

(86) PCT No.: PCT/EP2021/063554
§ 371 (c)(1),
(2) Date: Dec. 8, 2022

(87) PCT Pub. No.: WO2021/249739
PCT Pub. Date: Dec. 16, 2021

(65) Prior Publication Data
US 2023/0236519 A1 Jul. 27, 2023

Related U.S. Application Data

(60) Provisional application No. 63/036,645, filed on Jun. 9, 2020.

(51) Int. Cl.
G03F 9/00 (2006.01)
G02B 3/00 (2006.01)

(52) U.S. Cl.
CPC ............ *G03F 9/7011* (2013.01); *G02B 3/005* (2013.01); *G03F 9/7023* (2013.01);
(Continued)

(58) Field of Classification Search
CPC .... G03F 9/7011; G03F 9/7042; G03F 9/7065; G03F 9/7023; G03F 9/7069;
(Continued)

(56) References Cited

U.S. PATENT DOCUMENTS 5,072,126 A * 12/1991 Progler ................ G03F 9/7069
250/548
5,133,603 A 7/1992 Suzuki et al.
(Continued)

FOREIGN PATENT DOCUMENTS

CN 101382743 A 3/2009
CN 102081312 A 6/2011
(Continued)

OTHER PUBLICATIONS

International Search Report and Written Opinion of the International Searching Authority directed to International Patent Application No. PCT/EP2021/063554, mailed Sep. 13, 2021; 11 pages.
(Continued)

*Primary Examiner* — Georgia Y Epps
*Assistant Examiner* — Erin R Garber
(74) *Attorney, Agent, or Firm* — Sterne, Kessler, Goldstein & Fox 1P.L.L.C.

(57) ABSTRACT

A patterning device pre-alignment sensor system is disclosed. The system comprises at least one illumination source configured to provide an incident beam along a normal direction towards a patterning device. The system further comprises an object lens group channel along the normal direction configured to receive a 0th order refracted beam from the patterning device. The system further comprises a first light reflector configured to redirect the 0th order refracted beam to form a first retroreflected beam. The system further comprises a first image lens group channel configured to transmit the first retroreflected beam to a first light sensor. The first light sensor is configured to detect the first retroreflected beam to determine a location feature of the patterning device.

20 Claims, 10 Drawing Sheets

(52) U.S. Cl.
CPC .......... *G03F 9/7042* (2013.01); *G03F 9/7065* (2013.01); *G03F 9/7069* (2013.01); *G03F 9/7088* (2013.01)

(58) Field of Classification Search
CPC ...... G03F 9/7088; G03F 1/84; G03F 7/70616; G03F 1/24; G02B 3/005; G02B 27/10; G01N 21/956
See application file for complete search history.

(56) References Cited

U.S. PATENT DOCUMENTS

| | | | |
|---|---|---|---|
| 5,243,195 A | 9/1993 | Nishi | |
| 5,464,715 A | 11/1995 | Nishi et al. | |
| 5,859,707 A * | 1/1999 | Nakagawa | G03F 9/7065 356/399 |
| 6,727,978 B2 | 4/2004 | Nishi | |
| 2004/0130690 A1* | 7/2004 | Koren | G03F 9/7046 355/71 |
| 2004/0189966 A1* | 9/2004 | Van Der Werf | G03F 7/70591 355/71 |
| 2005/0117140 A1 | 6/2005 | Mishima | |
| 2005/0128452 A1 | 6/2005 | Matsumoto | |
| 2005/0254063 A1* | 11/2005 | Hill | G03F 1/84 356/512 |
| 2007/0081133 A1* | 4/2007 | Kayama | G03F 7/70775 355/72 |
| 2008/0088843 A1* | 4/2008 | Shibazaki | G03F 9/7088 356/399 |
| 2008/0089470 A1* | 4/2008 | Walmsley | G03F 7/7035 378/34 |
| 2008/0099941 A1 | 5/2008 | Suehira et al. | |
| 2012/0267802 A1* | 10/2012 | De Boer | G03F 9/7088 257/E23.179 |
| 2014/0264054 A1* | 9/2014 | Vladimirsky | G03F 7/7065 250/372 |
| 2017/0097574 A1* | 4/2017 | Goodwin | G01J 1/0448 |
| 2019/0304851 A1* | 10/2019 | Smith | G01N 21/9501 |
| 2020/0285129 A1* | 9/2020 | Uebel | G03F 9/7065 |

FOREIGN PATENT DOCUMENTS

| | | |
|---|---|---|
| EP | 1 308 789 B1 | 5/2003 |
| JP | S63138730 A | 6/1988 |
| JP | H04-324923 A | 11/1992 |
| JP | H09-8103 A | 1/1997 |
| JP | 2005-167139 A | 6/2005 |
| JP | 2006-078321 A | 3/2006 |
| JP | 2010-145313 A | 7/2010 |
| WO | WO 2020/249394 A1 | 12/2020 |

OTHER PUBLICATIONS

International Preliminary Report on Patentability directed to International Patent Application No. PCT/EP2021/063554, issued Dec. 13, 2022; 8 pages.

* cited by examiner

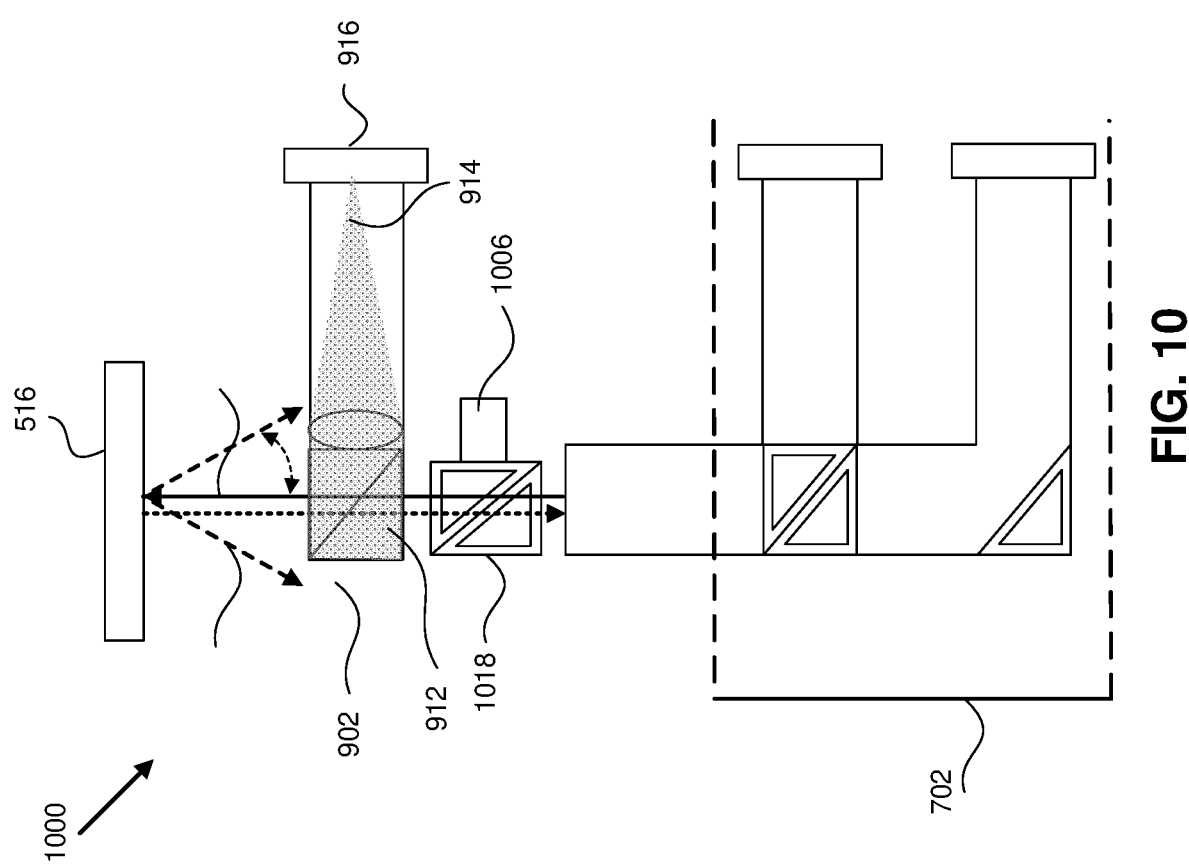

LITHOGRAPHIC PRE-ALIGNMENT IMAGING SENSOR WITH BUILD-IN COAXIAL ILLUMINATION

CROSS-REFERENCE TO RELATED APPLICATIONS

This application claims priority of U.S. Provisional Patent Application No. 63/036,645, which was filed on Jun. 9, 2020, and which is incorporated herein in its entirety by reference.

FIELD

The present disclosure relates pre-alignment imaging sensors with build-in coaxial illumination that may be used, for example, in a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs) or other devices designed to be functional. In that instance, a patterning device, which is alternatively referred to as a mask or a reticle, may be used to generate a circuit pattern to be formed on an individual layer of the device designed to be functional. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

Manufacturing devices, such as semiconductor devices, typically involves processing a substrate (e.g., a semiconductor wafer) using a number of fabrication processes to form various features and often multiple layers of the devices. Such layers and/or features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a pattern transfer step, such as optical and/or nanoimprint lithography using a lithographic apparatus, to provide a pattern on a substrate and typically, but optionally, involves one or more related pattern processing steps, such as resist development by a development apparatus, baking of the substrate using a bake tool, etching the pattern by an etch apparatus, etc. Further, one or more metrology processes are involved in the patterning process.

Metrology processes are used at various steps during a patterning process to monitor and/or control the process. For example, metrology processes are used to measure one or more characteristics of a substrate, such as a relative location (e.g., registration, overlay, alignment, etc.) or dimension (e.g., line width, critical dimension (CD), thickness, etc.) of features formed on the substrate during the patterning process, such that, for example, the performance of the patterning process can be determined from the one or more characteristics. If the one or more characteristics are unacceptable (e.g., out of a predetermined range for the characteristic(s)), one or more variables of the patterning process may be designed or altered, e.g., based on the measurements of the one or more characteristics, such that substrates manufactured by the patterning process have an acceptable characteristic(s).

With the advancement of lithography and other patterning process technologies, the dimensions of functional elements have continually been reduced while the amount of the functional elements, such as transistors, per device has been steadily increased over decades. In the meanwhile, the requirement of accuracy in terms of overlay, critical dimension (CD), etc. has become more and more stringent. Error, such as error in overlay, error in CD, etc., will inevitably be produced in the patterning process. For example, imaging error may be produced from optical aberration, patterning device heating, patterning device error, and/or substrate heating and can be characterized in terms of, e.g., overlay, CD, etc. Additionally or alternatively, error may be introduced in other parts of the patterning process, such as in etch, development, bake, etc. and similarly can be characterized in terms of, e.g., overlay, CD, etc. The error may cause a problem in terms of the functioning of the device, including failure of the device to function or one or more electrical problems of the functioning device. Accordingly, it is desirable to be able to characterize one or more these errors and take steps to design, modify, control, etc. a patterning process to reduce or minimize one or more of these errors.

One such error that may be produced involves the transfer of the patterning device to and along with a corresponding patterning device electrostatic chuck. Such transfer may result in potential damage to the patterning device, chuck, or both, if a relative tilt of the patterning device and patterning device electrostatic chuck is improper. For example, variations of the patterning device mechanical and positioning tolerances, can lead to high corner impacts and unpredictable first contact points with the electrostatic chuck, thus potentially damaging one or both.

Moreover, the relative tilt of the patterning device and/or damage caused by the titled patterning device as it is transferred to the electrostatic chuck may also cause potential inaccuracies in the patterning process, which may result in damaged or non-performing circuits. As such, these errors can also contribute to added costs due to damage of the equipment, inefficient processing, waste, and processing delays.

SUMMARY

Accordingly, there is a need to provide pre-alignment image sensor of a patterning device to protect the patterning device and an electrostatic chuck during a transfer operation, and further, to ensure patterning accuracy.

In some embodiments, the disclosed patterning device pre-alignment sensor system comprises: at least one illumination source configured to provide an incident beam along a normal direction towards a patterning device; an object lens group channel along the normal direction configured to receive a 0th order refracted beam from the patterning device; a first light reflector configured to redirect the 0th order refracted beam to form a first retroreflected beam; and, a first image lens group channel configured to transmit the first retroreflected beam to a first light sensor. The first light sensor is configured to detect the first retroreflected beam to determine a location feature of the patterning device.

In some embodiments, the at least one illumination source includes a first illumination source arranged close to the first reflector light reflector, and configured to emit the incident beam along the object lens group channel.

In some embodiments, the at least one illumination source includes a first illumination source arranged close to the first image lens group channel; and the first image lens group channel includes a first source reflector configured to redirect the incident light emitted from the first illumination source to a direction along first image lens group channel.

In some embodiments, the first light reflector comprises a first beam splitter; and the system further comprises: a lower object lens group channel configured to receive the 0th order refracted beam from the first beam splitter, a second light reflector configured to redirect the 0th order refracted beam to form a second retroreflected beam, and a second image lens group channel configured to transmit the second retroreflected beam to a second light sensor The second light sensor is configured to detect the second retroreflected beam to determine a further location feature of the patterning device.

In some embodiments, the first and second light sensors are configured to detect the first and second retroreflected beams to determine an X-Y planar location feature and a rotation feature of the patterning device.

In some embodiments, the at least one illumination source includes a first illumination source arranged close to the second reflector light reflector, and configured to emit the incident beam along the lower object lens group channel.

In some embodiments, the first illumination source simultaneously illuminates the first and second image lens group channels.

In some embodiments, the at least one illumination source further includes a second illumination source arranged close to the second reflector light reflector, and configured to emit the incident beam along the lower object lens group channel; and the first illumination source and the second illumination source produce different wavelengths.

In some embodiments, the at least one illumination source comprises: a first illumination source arranged close to the first image lens group channel; and a second illumination source arranged close to the second image lens group channel. The first image lens group channel includes a first source reflector configured to redirect the incident light emitted from the first illumination source to a first direction along the first image lens group channel, and the second image lens group channel includes a second source reflector configured to redirect the incident light emitted from the second illumination source to a second direction along the second image lens group channel.

In some embodiments, the first illumination source and the second illumination source produce different wavelengths.

In some embodiments, the system further comprises: a third light reflector configured to redirect the 0th order refracted beam to form a third retroreflected beam, and a third image lens group channel including a collimator configured to focus the third retroreflected beam to a third light sensor. The third light sensor is configured to detect the focused third retroreflected beam to determine a relative tilt of the patterning device.

In some embodiments, the at least one illumination source includes a first illumination source arranged close to the second reflector light reflector, and configured to emit the incident beam along the lower object lens group channel to simultaneously illuminate the first, second and the third image lens group channels.

In some embodiments, the at least one illumination source further includes: a second illumination source arranged close to the second reflector light reflector, and configured to emit the incident beam along the lower object lens group channel; and the first illumination source and the second illumination source produce different wavelengths.

In some embodiments, the at least one illumination source includes a third light source that generates a collimated beam, the collimated beam illuminates the patterning device; the third light sensor is configured to measure the relative tilt of the patterning device based on a displacement measurement between a focal point of the third light sensor and a point created by the focused third retroreflected beam.

In some embodiments, the third light source is a coaxial Kohler illumination source configured to provide an even illumination of the patterning device.

In some embodiments, the third light source is arranged close to the third image lens group channel. The third image lens group channel includes a third source reflector configured to redirect the collimated beam emitted from the third illumination source to a third direction along the third image lens group channel.

In some embodiments, the third light source is arranged within the object lens group channel.

In some embodiments, the at least one illumination source includes: a first illumination source arranged adjacent to the first image lens group channel; a second illumination source arranged adjacent to the second image lens group channel; and a third illumination source arranged adjacent to the third image lens group channel. In some embodiments, the first image lens group channel includes a first source reflector configured to redirect the incident light emitted from the first illumination source to a first direction along the first image lens group channel, the second image lens group channel includes a second source reflector configured to redirect the incident light emitted from the second illumination source to a second direction along the second image lens group channel, and the third image lens group channel includes a third source reflector configured to redirect the incident light emitted from the third illumination source to a third direction along the third image lens group channel.

In some embodiments, the present disclosure also provides a lithographic apparatus comprising a disclosed patterning device pre-alignment sensor system.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 5-10 show schematics of various pre-alignment sensor systems, according to various embodiments.

Figure 1:
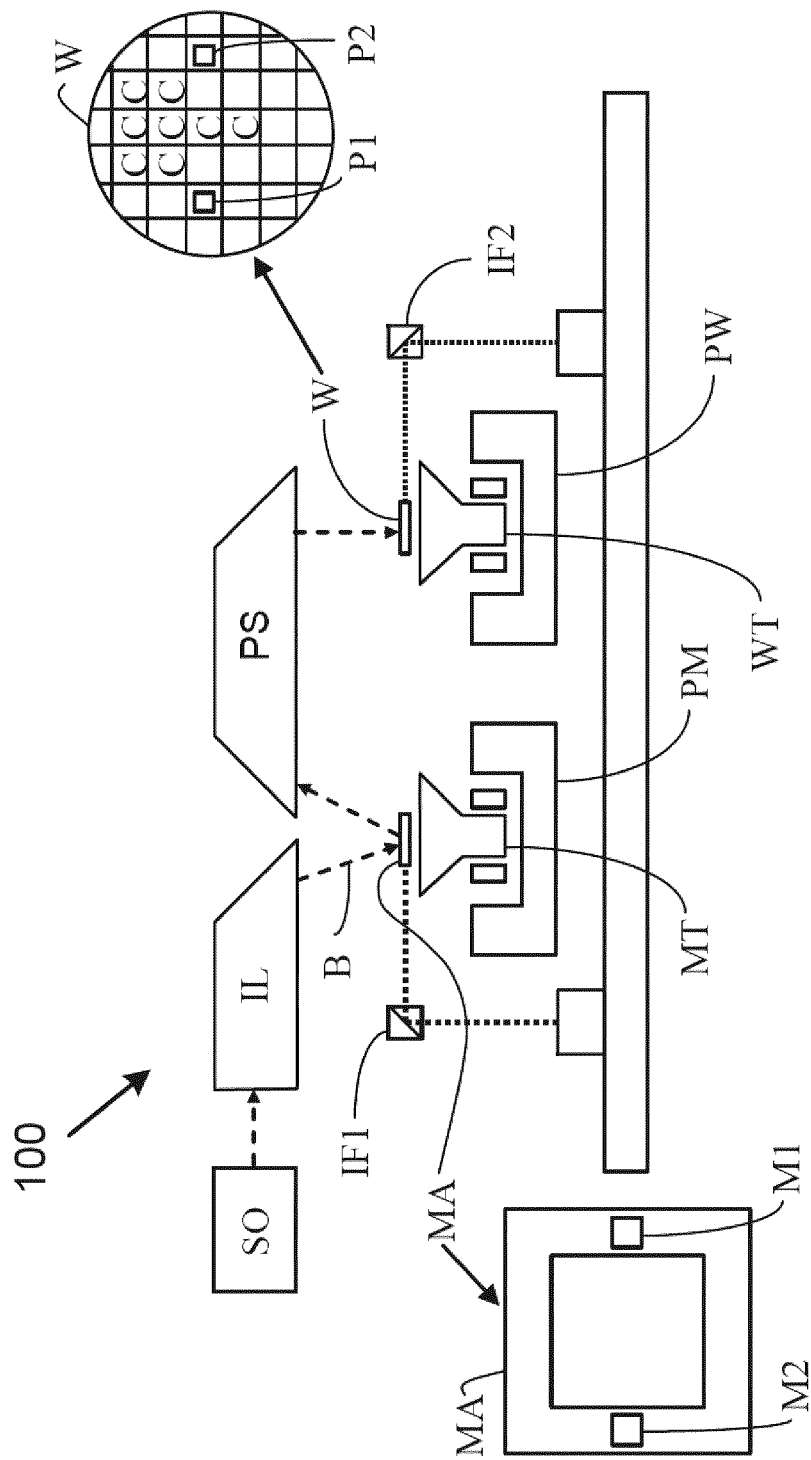
FIG. 1 shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, can be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus can be otherwise oriented (rotated 90 degrees or at other orientations) and the spatially relative descriptors used herein may likewise be interpreted accordingly.

The term "about" can be used herein to indicate the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the present disclosure can be implemented in hardware, firmware, software, or any combination thereof. Embodiments of the present disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, non-transitory computer readable instructions, etc.

Before describing such embodiments in more detail, however, it is instructive to present an example environment in which embodiments of the present disclosure can be implemented.

Example Lithographic Systems

Figure 2:
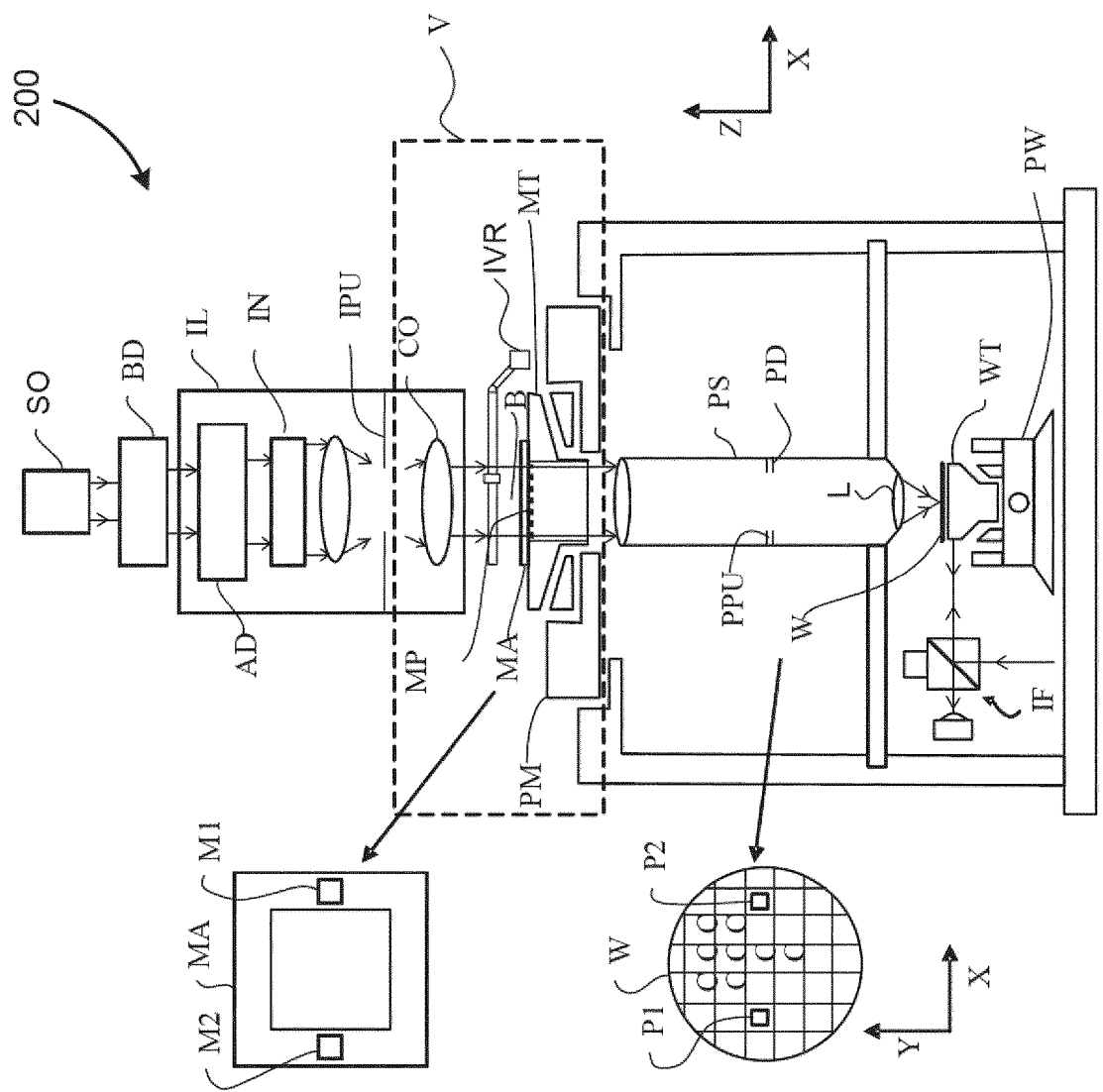
FIG. 2 shows a schematic of a transmissive lithographic apparatus, according to some embodiments.

FIGS. 1 and 2 show schematics of a lithographic apparatus 100 and lithographic apparatus 200, respectively, according to some embodiments. In some embodiments, lithographic apparatus 100 and lithographic apparatus 200 each include the following: an illumination system (illuminator) IL configured to condition a radiation beam B (for example, deep ultra violet or extreme ultra violet (EUV) radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. As will be further described herein, other configurations of the illuminator may be implemented to for improved illumination, and compactness of design.

Lithographic apparatus 100 and 200 also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 200, the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 200, and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 200 of FIG. 2) or reflective (as in lithographic apparatus 100 of FIG. 1). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 200 can 0 can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 200 can be separate physical entities, for example, when the source SO is an excimer laser. In such cases, the source SO is not considered to form part of the lithographic apparatus 100 or 200, and the radiation beam B passes from the source SO to the illuminator IL with the aid of a beam delivery system BD (in FIG. 2) including, for example, suitable directing mirrors and/or a beam expander. In other cases, the source SO can be an integral part of the lithographic apparatus 100, 200—for example when the source SO is a mercury lamp. The source SO and the illuminator IL, together with the beam delivery system BD, if required, can be referred to as a radiation system.

The illuminator IL can include an adjuster AD (in FIG. 2) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 2), such as an integrator IN and a condenser CO. The illuminator IL can be used to condition the radiation beam B to have a desired uniformity and intensity distribution in its cross section.

Referring to FIG. 1, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 2, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 2) can be used to accurately position the mask MA with respect to the path of the radiation beam B (for example, after mechanical retrieval from a mask library or during a scan).

In some embodiments, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

Lithographic apparatus 200 can include a patterning device transfer system. An example patterning device transfer system may be a patterning device exchange apparatus (V) including, for example, in-vacuum robot IVR, mask table MT, first positioner PM and other like components for transferring and positioning a patterning device. Patterning device exchange apparatus V may be configured to transfer patterning devices between a patterning device carrying container and a processing tool (e.g., lithographic apparatus 200).

The lithographic apparatus 100 and 200 can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-) magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In some embodiments, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 3:
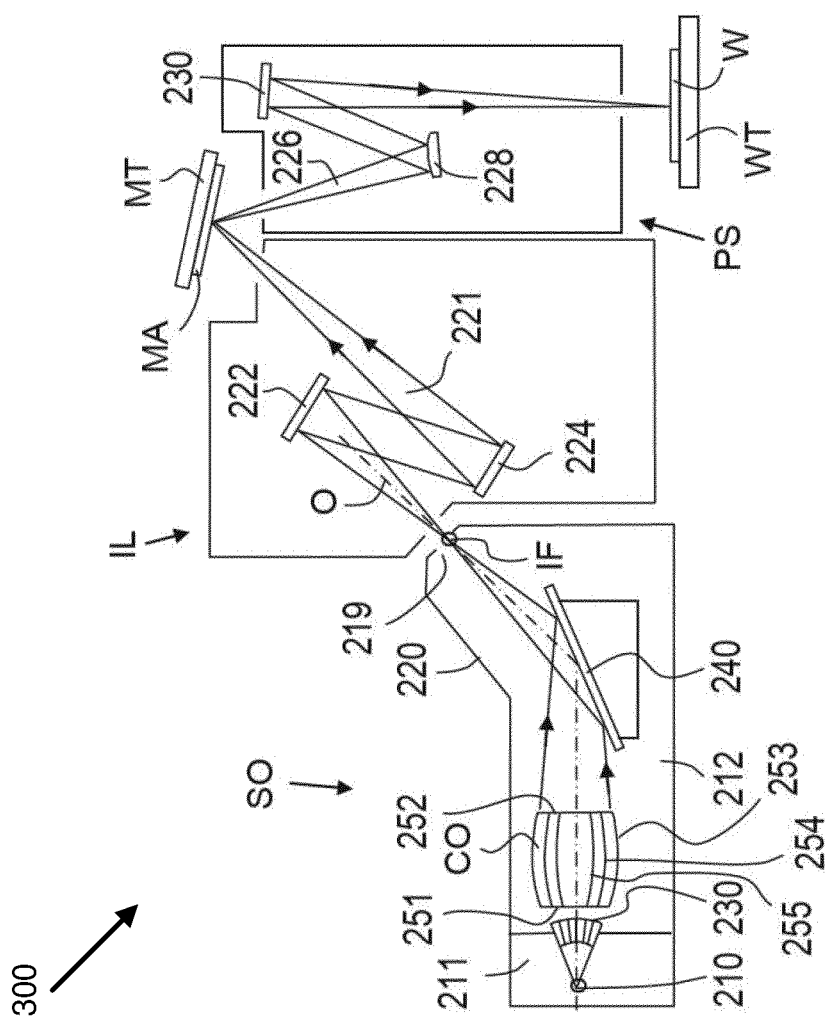
FIG. 3 shows a detailed schematic of a reflective lithographic apparatus, according to some embodiments.

FIG. 3 shows lithographic apparatus 300 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 can be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 can include a channel structure. Contamination trap 230 can also include a gas barrier or a combination of a gas barrier and a channel structure. The contaminant trap or contaminant barrier 230 further indicated herein at least includes a channel structure, as known in the art.

The collector chamber 212 can include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 can optionally be present, depending upon the type of lithographic apparatus. Further, there may be more mirrors present than those shown in the figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cell

Figure 4:
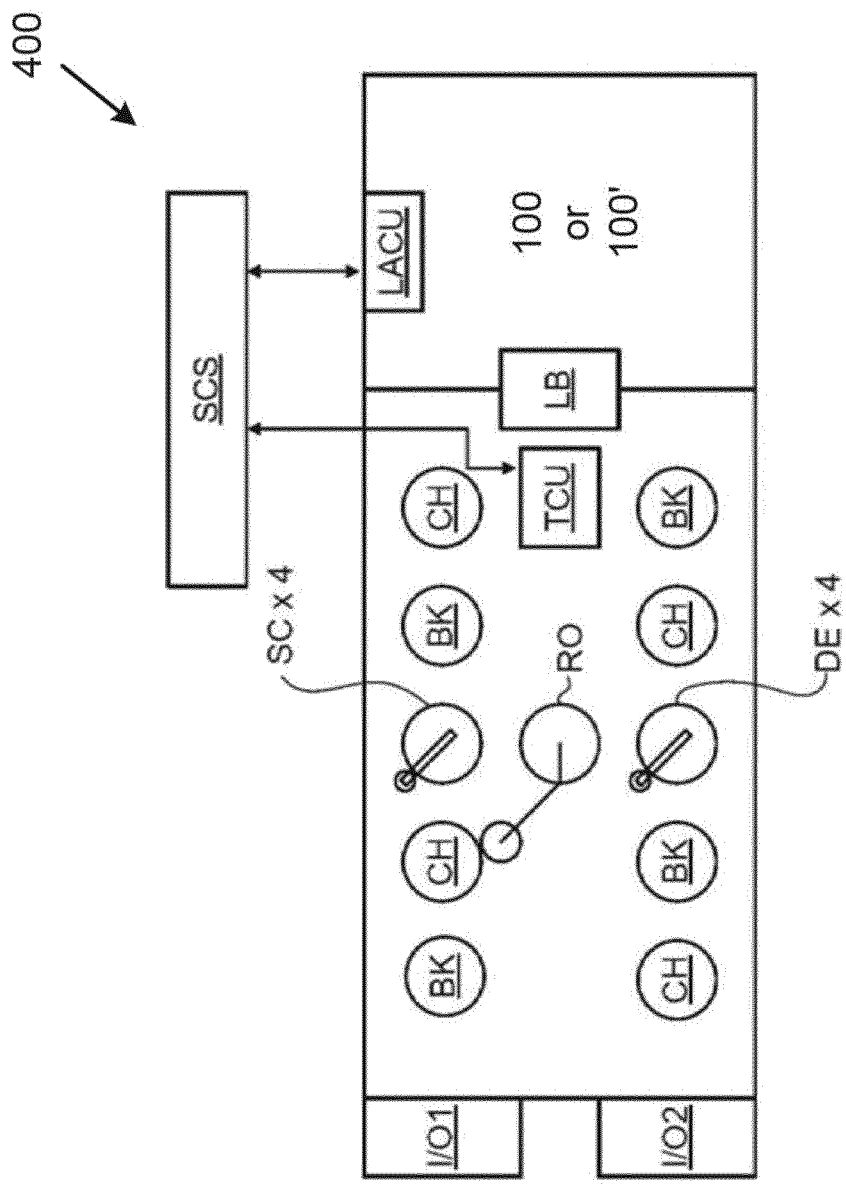
FIG. 4 shows a schematic of a lithographic cell, according to some embodiments.

FIG. 4 shows a schematic of a lithographic cell 300, also sometimes referred to a lithocell or cluster. Lithographic apparatus 100 or 200 can form part of lithographic cell 400. Lithographic cell 300 can also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU.

Thus, the different apparatus can be operated to maximize throughput and processing efficiency.

Exemplary Embodiments of a Pre-Alignment System

Figure 5:
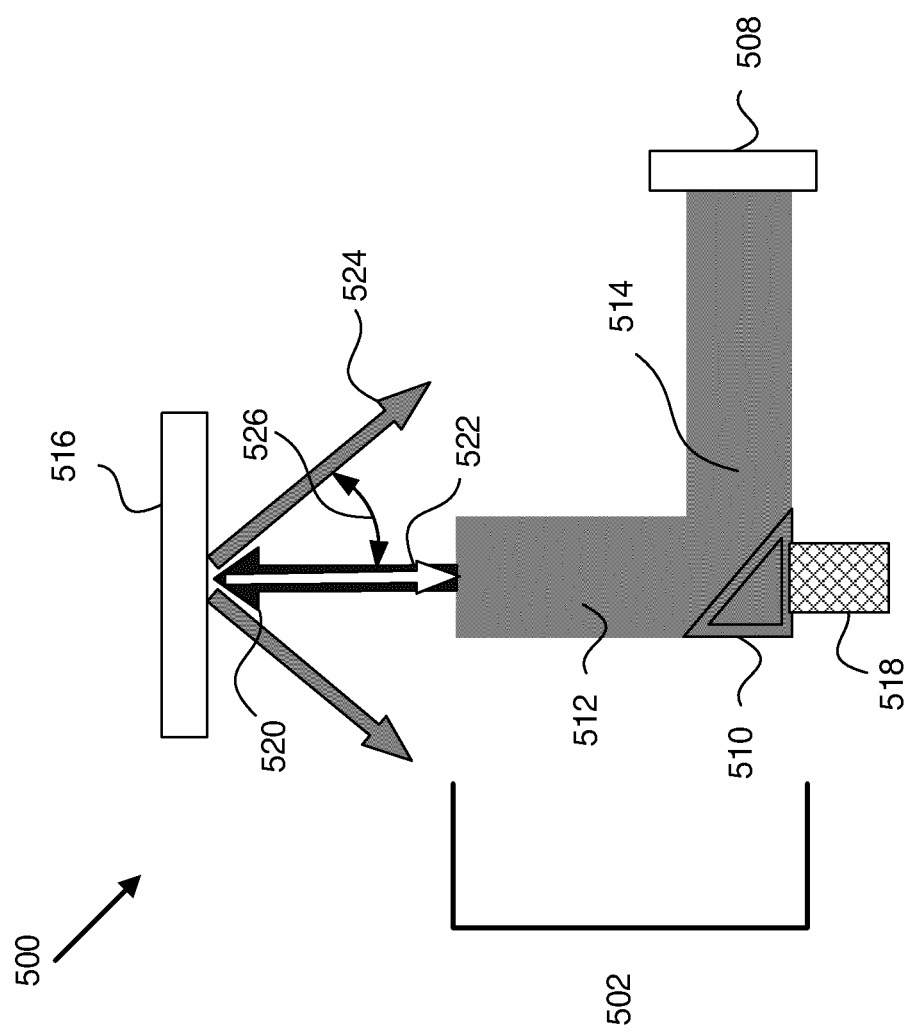

FIG. 5 shows a schematic of a pre-alignment system 500 measuring positioning of a patterning device in X-, Y-positions and Rx orientation using build-in coaxial illumination, according to some embodiments.

In one embodiment, pre-alignment system 500 can be a patterning device (e.g., reticle) pre-alignment system that includes a coaxial illumination source 518 and a single path sensory system 502. In some embodiments, coaxial illumination source 518 can be an LED, or a laser produced plasma, and configured for providing an incident beam along a normal direction towards patterning device 516. Single path sensory system 502 can include an object lens group 512 to form an object light path (or object lens group channel), and an image lens group 514 to form an image light path (or image lens group channel). It is understood within this specification that the terms of optical system, lens system, lens group, optical path, light path, and lens channel may be used interchangeably.

In some embodiments, upon detecting the presence of patterning device 516, pre-alignment system 500 can illuminate the patterning device to perform the requisite inspection measurements. As shown in FIG. 5, pre-alignment system 500 can include coaxial illumination source 518 that is coaxial with object lens group 512 and configured to provide the illumination and incident beam 520 onto patterning device 516. For example, incident beam 520 from coaxial illumination source 518 can go through a light reflector (e.g., a mirror, a beam splitter, etc.) 510 and object light path group 512 to illuminate patterning device 516.

The incident beam 520 can be reflected, diffracted, scattered, or the like from the patterning device, and generate $0^{th}$ order diffracted beam 522 and $\pm 1^{th}$ order diffracted beam 524. The generated $0^{th}$ order diffracted beam 522 can go through object lens group 512, and then be reflected by reflector 510 to form a retroreflected beam.

The retroreflected beam can go through image lens group 514 and reach light detector (or sensor) 508. Light detector 508 and reflector 510 are each located at an opposite end of the other at image lens group 514. As shown in FIG. 5, light reflector 510 is located between object lens group 512 and image lens group 514 to reflect the $0^{th}$ order diffracted beam 522 from an illuminated patterning device to form the retroreflected beam towards light detector 508.

Light detector 508 can be formed of a sensor or an array of sensors that may be capacitive or include one or more planar electrodes. Each sensor or array may be optical and may include a light detector, such as a photodiode, (e.g., a quadrant avalanche photodiode or the like). Light detector 508 can be configured to detect the retroreflected beam to measure the X-Y position of the patterning device and the orientation of the patterning device (e.g., the Rz orientation).

In some embodiments, a patterning device transfer apparatus (e.g., patterning device exchange apparatus V in FIG. 2) may be configured to minimize patterning device/reticle exchange time, particle generation, and reduce contact forces or stresses from a chuck and/or a patterning device, such as patterning device 516. The patterning device exchange apparatus V may also increase overall throughput in a patterning device exchange process, for example, in a lithographic apparatus LA.

In some existing pre-alignment system, a series of illuminators are arranged in a tilted illumination scheme to project incident beams onto the patterning device. Depending on the illumination, the $1^{st}$ order the diffraction beam is collected by the object lens group. That is, the series of illuminators are tiled at an angle equal to the diffraction angle 526 between $0^{th}$ order diffracted beam and $1^{st}$ order the diffraction beam. A high percentage (e.g., upwards of about 99%) of the energy of the refracted light constitutes the $0^{th}$ order beam 522. Thus, when using tilted illumination scheme, multiple light sources are used to ensure that an intensity of the $1^{st}$ order the diffraction beam is strong enough to be detected by light detector or sensor. For example, an existing EUV pre-alignment sensor utilizes four light emitting diodes (LEDs). By using the disclosed coaxial illumination, since the $0^{th}$ order diffracted beam from the target is collected by the object lens group for sensing purpose, only one LED can be used to provide sufficient intensity to detect the $0^{th}$ order diffraction beam.

Figure 6:
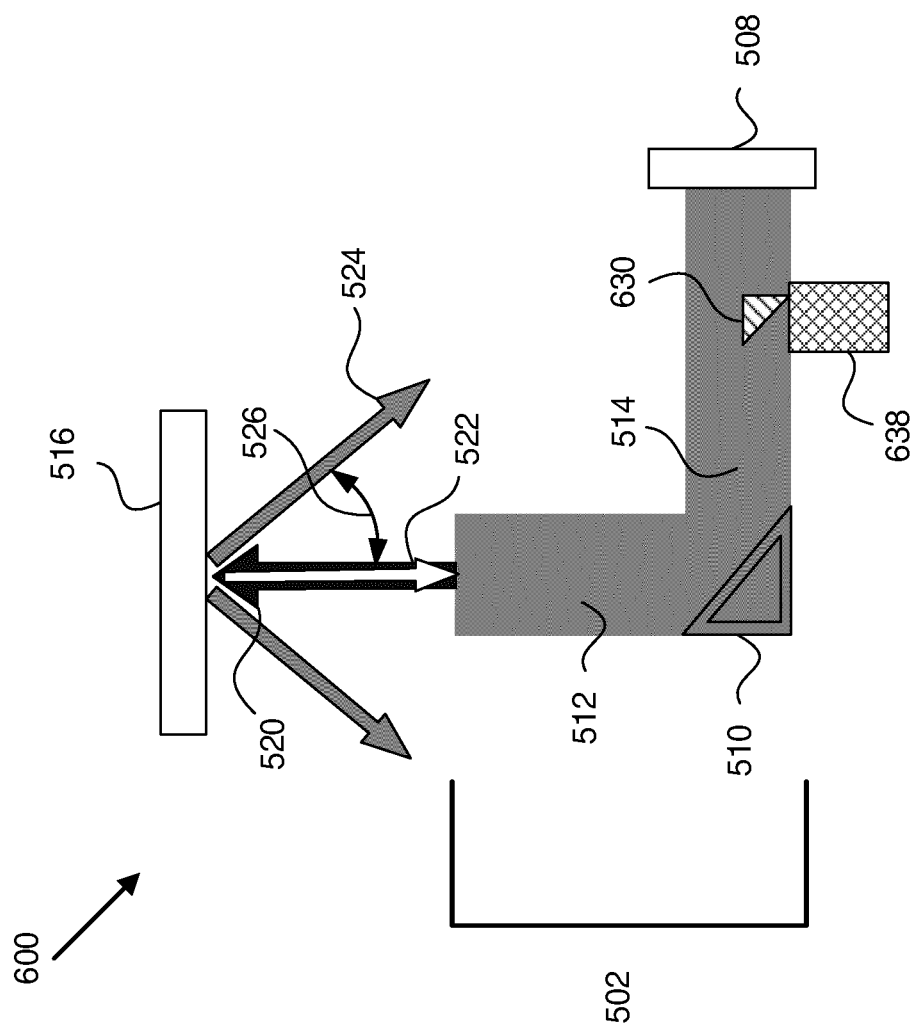

It is noted that, coaxial illumination source may be mounted at different positions within the pre-alignment system depending on desired size and performance consideration of the pre-alignment system. For example, as shown in FIG. 6, a schematic of a pre-alignment sensor 600 measuring positioning of a patterning device in X-, Y-positions and Rx orientation using coaxial illumination, according to some other embodiments. Pre-alignment sensor 600 can be equivalent in construction and components to that of pre-alignment sensor 500, with a difference: coaxial illumination source 638 is arranged at a location close to image lens group 514. A light source reflector 630 is configured to reflect the illumination beam generated from coaxial illumination source 638 to the direction of the optical axis of image lens group 514 (horizontal direction as shown in FIG. 6).

Figure 7:
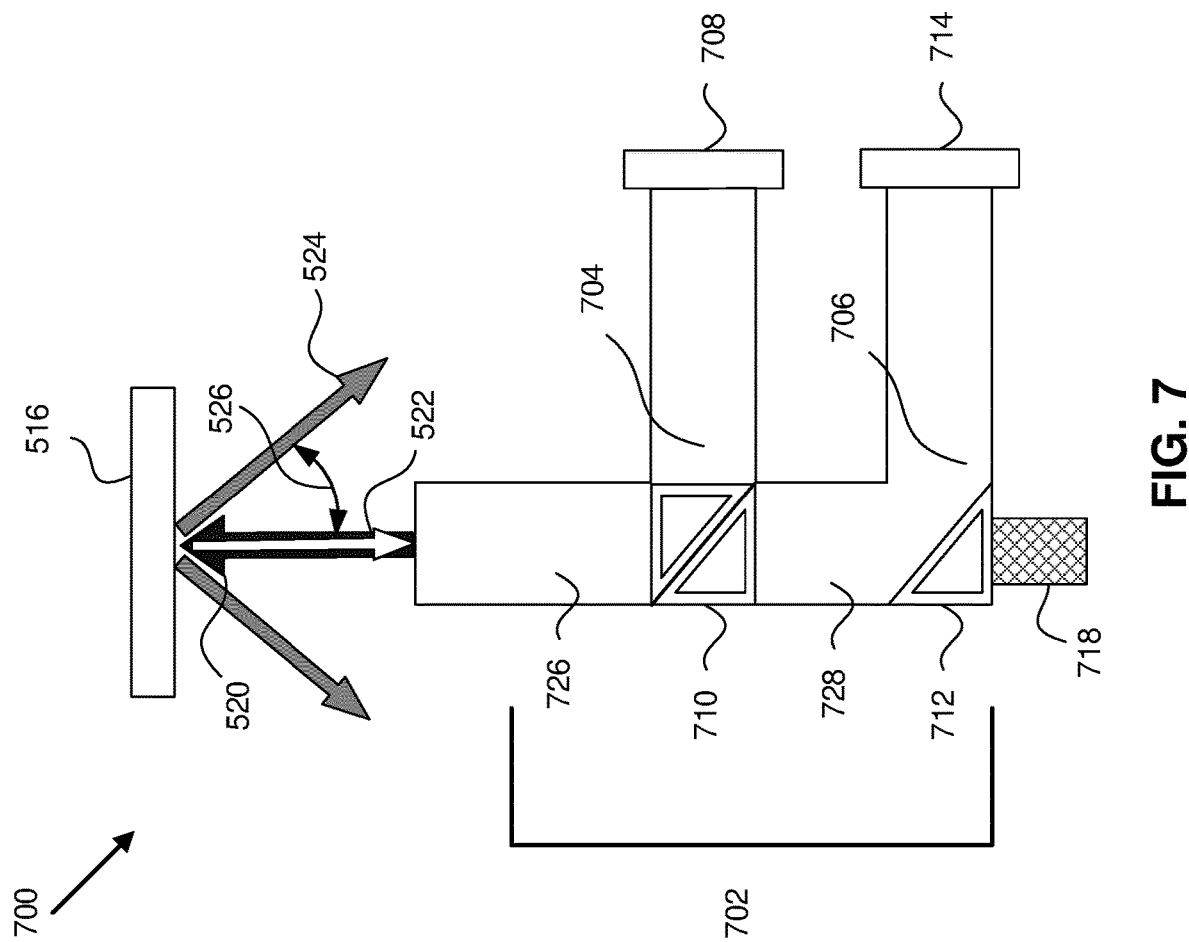

In some embodiments, the coaxial illumination source may be used to illuminate multiple optical channels/paths simultaneously (e.g., an upper light path and one of the plurality of lower light paths) for imaging and/or other applications. FIG. 7 shows a schematic of a pre-alignment system 700 measuring positioning of a patterning device in X-, Y-positions and Rx orientation using build-in coaxial illumination, according to some other embodiments.

In one embodiment, pre-alignment system 700 can be a patterning device (e.g., reticle) pre-alignment system that includes a coaxial illumination source 718 and a multipath sensory array 702 including multiple lens groups. For example, in one embodiment, multipath sensory array 702 includes include a common object light path 726, a lower object light path 728, an upper image light path 704, and a lower image light path 706.

In some embodiments, upon detecting the presence of patterning device 516, pre-alignment system 700 can illuminate the patterning device to perform the requisite inspection measurements. As shown in FIG. 7, pre-alignment system 700 can include coaxial illumination source 718 that is coaxial with common object light path 726 and lower object light path 728, and configured to provide the illumination and incident beam 520 onto patterning device 516.

For example, incident beam 520 from coaxial illumination source 518 can go through lower object light path 728 and common object light path 726 to illuminate patterning device 516.

The incident beam 520 can be reflected, diffracted, scattered, or the like from the patterning device, and generate $0^{th}$ order diffracted beam 522 and $\pm 1^{th}$ order diffracted beam 524. The generated $0^{th}$ order diffracted beam 522 can go through common object light path 726 and lower object light path 728, and be reflected by upper reflector 710 and lower reflector 712 to form two retroreflected beams.

Upper beam splitter 710 can split the received 0$^{th}$ diffracted beam into two beams, the first may be directed onto upper light detector 708, and the second may be directed towards lower image light path 706. Lower image light path 706 can include a lower beam splitter or a mirror 712 (depending on whether additional lower channels are utilized). The two retroreflected beams can go through upper image light path 704 and lower image light path 706, and reach upper light detector 708 and lower light detector 714 respectively. Upper light detector 708 and upper reflector 710 are each located at an opposite end of the other at upper image lens group 704. Lower light detector 714 and lower reflector 712 are each located at an opposite end of the other at lower image lens group 706.

Upper light detector 708 and lower light detector 714 can each be formed of a sensor or an array of sensors that may be capacitive or include one or more planar electrodes. Each sensor or array may be optical and may include a light detector, such as a photodiode, (e.g., a quadrant avalanche photodiode or the like). As shown in FIG. 7, upper reflector 710 is located between common object lens group 726 and upper image lens group 704, and configured to redirect a portion of 0$^{th}$ order diffracted beam 522 towards upper light detector 708. Similarly, lower reflector 712 is located between lower object lens group 728 and lower image lens group 706, and configured to redirect a portion of 0$^{th}$ order diffracted beam 522 towards lower light detector 714.

In some embodiments, pre-alignment system 700 utilizes the two-channel configuration described in FIG. 7 to measure patterning device position offsets. For example, pre-alignment system 700 can utilize upper image light path 704 and lower image light path 706 to measure the X-Y position of the patterning device and the orientation of the patterning device (e.g., the Rz orientation).

In some embodiments, upper image light path 704 and lower image light path 706 can be set up with different configurations to measure different characteristics of reflected beams. For example, when patterning device 516 is illuminated, the incident light may be reflected (or refracted in this instance) and partially modified by patterns found on the patterning device. Upon receiving the refracted beam, upper image light path 704 and lower image light path 706 receive the same beam signal and depending on their set up, may provide analysis and measurements for different optical characteristics of patterning device 516.

In one example, upper image light path 704 can receive the beam and project the image of the patterning device onto upper light detector 708 for measuring X- and Y-positions of patterning device by processing the image of the patterning device and detecting device markers on the patterning device. Additionally, upper light detector 708 can be configured as a bar code reader and may be configured to read a bar code within the patterning device image to identify the patterning device. Similarly, lower image light path 706 can receive the beam and project the image of the patterning device onto lower light detector 714 for inverting the image of the patterning device to measure different alignment and/or positioning attributes. It is noted that, upper image light path 704 and lower image light path 706 can be configured, along with their respective sensors, to perform other optical measurements of patterning device image.

As described above, in the existing tilted illumination scheme, multiple light sources are arranged at an angle designed to satisfy diffraction requirement imposed by a 2D diffraction grating formed on the elements of an alignment mark. In this regard, the illuminator tilt angle may be specific to an illumination wavelength employed, and a grating period in the features of an alignment mark within the patterning device. Since two-channel configuration or multi-channel configuration may require different wavelengths for measuring different characteristics of reflected beams, the existing tilted illumination scheme requires even more number of light sources to be arranged at different angles designed to satisfy different diffraction requirements based on the different wavelengths of reflected beams. For example, an existing EUV pre-alignment sensor may utilize eight light emitting diodes (LEDs) for the two-channel configuration.

The use of the disclosed coaxial illumination may help reduce complexities of setting up illumination sources in tilted illumination. In some embodiments, coaxial illumination source 718 can be used to illuminate all optical channels/paths simultaneously (e.g., an upper light path and one of the plurality of lower light paths) for imaging and/or other applications. For example, different light sources with different wavelengths may be mounted at a same location coaxial with the common object lens group 726 and lower object lens group 728. Thus, coaxial illumination may provide added benefits, including ease of illuminator mounting and alignment, independence from wavelength of illumination, ease of illuminator replacement, potential use of a single illuminator for both channels, and illumination uniformity.

Figure 8:
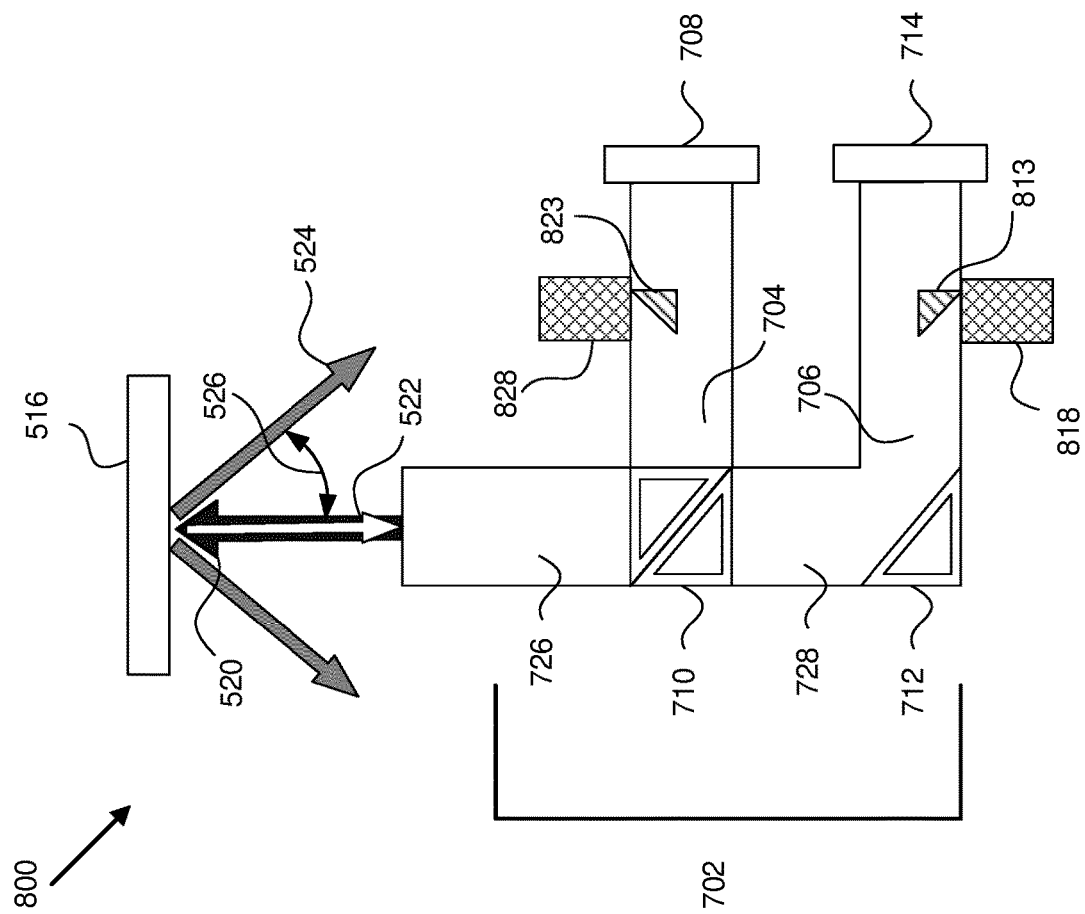

It is also noted that, the coaxial illumination sources with different wavelength may be mounted separately at different positions within the pre-alignment system depending on desired size and performance consideration of the pre-alignment system. For example, as shown in FIG. 8, a schematic of a pre-alignment sensor 800 measuring positioning of a patterning device in X-, Y-positions and Rx orientation using coaxial illumination, according to some other embodiments. Pre-alignment sensor 800 can be equivalent in construction and components to that of pre-alignment sensor 700, with a difference: two separate coaxial illumination sources 818 and 828 can be arranged close to upper image lens group 704 and lower image lens group 706 respectively. Coaxial illumination sources 818 and 828 can have different wavelengths. Upper light source reflector 823 can be configured to reflect the illumination beam generated from upper coaxial illumination source 828 to the direction of the optical axis of upper image lens group 704. Lower light source reflector 813 is configured to reflect the illumination beam generated from lower coaxial illumination source 818 to the direction of the optical axis of lower image lens group 706.

Figure 9:
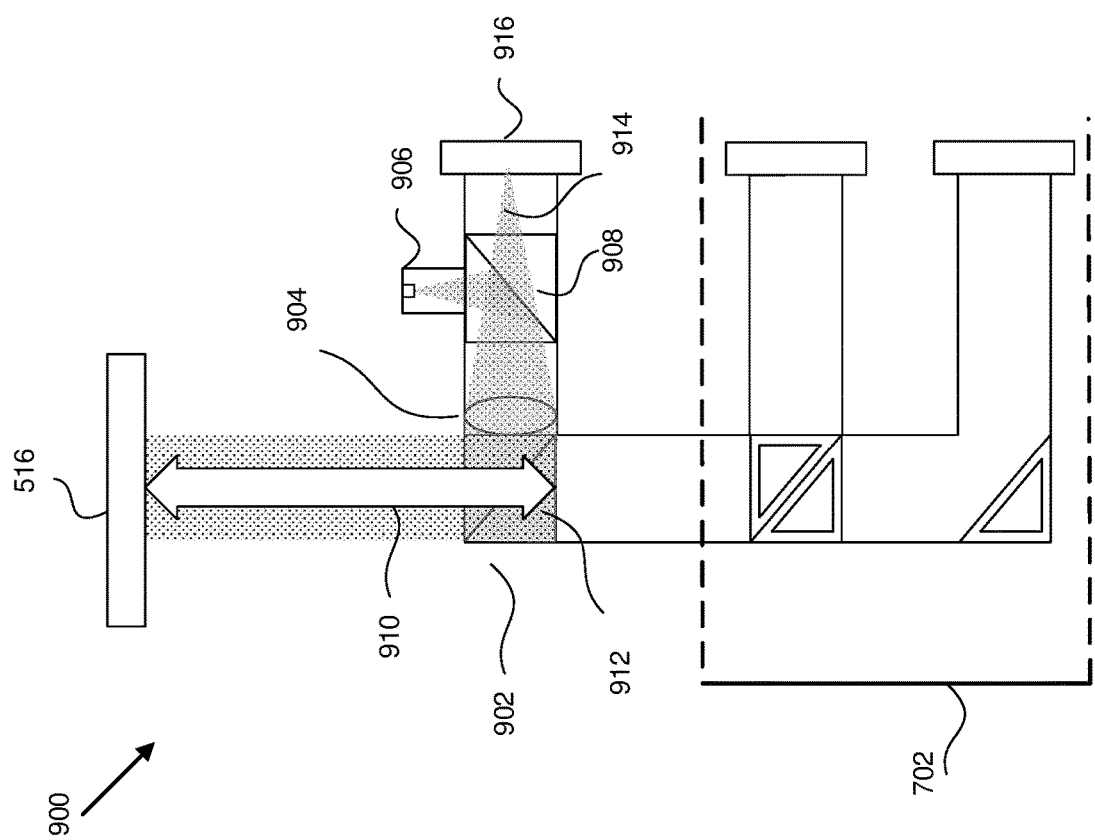

In some embodiments, the multipath sensory array may include more light paths that can be equipped to measure different properties and/or attributes of the patterning device image. FIG. 9 shows a schematic of a pre-alignment system 900 including a collimating optical branch as a level sensor, according to some embodiments. As previously indicated, patterning device level alignment (in the X and Y directions) is important in the patterning device transfer stage of lithography. A patterning device that is not level or is misaligned may be damaged in transfer to an electrostatic chuck for example. Such misalignment may also lead to damage of the electrostatic chuck itself, causing added costs, and delays in processing. Moreover, such damage, may affect the accuracy of the lithographic process.

Accordingly, pre-alignment system 700 shows a schematic for a multi-channel (e.g., multi-branch, multiple light path) system that measures patterning device position, orientation and tilt within a compact and efficient design, as further described herein.

In some embodiments, pre-alignment system 900 includes a three channel (branch) sensory array that incorporates an additional sensory array channel 902 from pre-alignment systems described in FIGS. 8 and 9. Sensory array channel 902 can be configured as a collimating channel by the inclusion of collimator 904 within the channel. Sensory array channel 902 can interchangeably be referred to as collimating light path 902. In some embodiments, collimating light path 902 can include a coaxial illumination source 906 coupled to beam splitter 908. Coaxial illumination source 906 provides incident illumination onto patterning device 516. After being illuminated, patterning device 516 can reflect and/or refract the beam, thus providing a $0^{th}$ order refracted beam 910.

In some embodiments, the coaxial illumination may be a Kohler illumination that acts to generate an even illumination and ensures that an image of the illumination source is not visible in the resulting image. For example, Kohler illumination may act to generate an even illumination of an object, e.g., the patterning device or a reticle, and ensure that an image of the illumination source is not visible in the resulting image. Kohler coaxial illumination may provide the added benefit of reducing glare and uneven illumination. This will result in reduced interference with the generated patterning device image because the illumination source will not be visible.

In some embodiments, $0^{th}$ order refracted beam 910 is split via beam splitter 912, and projected to (a) lower sensory array light paths 702 (for measuring positioning and Rx of the patterning device) and to (b) collimator 904 within collimating light path 902. Upon receiving the retroreflected beam reflected from beam splitter 912, collimator 904 provides collimated beam 914 projected onto an optical sensor, such as detector 716.

According to one embodiment, the multipath sensory array may include a combination of collimating light path 902 in combination with a lower multipath sensory array (e.g., sensory array 702 including upper light path 704 and lower light path 706). Such combination provides for performance and packaging benefits. For example, by combining collimating light path 902, designed to detect level gauge of a patterning device, and further, to measure the patterning device tilt with multipath sensory array 702 (which processes the patterning device image) provides for simplified packaging that separates interfering measurements. This implementation enables the combination of measuring characteristics of collimated light signals as well as measuring characteristics of image data of the patterning device in a single pre-alignment sensor device that incorporates compact packaging as well as performing multiple measurements of the patterning device.

In one example, pre-alignment system 900 can be configured to allow collimating light path 902 to be used simultaneously with any of the lower two light paths. This may reduce measurement time, processing power usage, processing capacity and the like, by extracting data only from sensors associated with the light paths.

FIG. 10 shows a schematic of a pre-alignment system 1000 including a collimating optical branch and an illuminator block below the level sensor, according to some embodiments. In some embodiments, the modular configuration of pre-alignment system 1000 allows for the placement of the coaxial illumination source 1006 in different positions, based on size requirements of the pre-alignment system itself, as well as the multichannel/multipath configuration. For example, the illuminator may be placed in a common space belonging to two or more channels (light paths). This may result in a reduction in light loss due to the minimal number of optical elements between the light source and the patterning device. Additionally, the illuminator may benefit from added space provided within the common space.

In some embodiments, coaxial illumination source 1006 can be implemented as the sole illumination source for the entire pre-alignment system 1000. This configuration may provide added benefits, such as module compactness and even illumination of the patterning device sample. Alternatively, coaxial illumination source 1006 can be implemented as the illumination source for collimating light path 902, while a different coaxial illumination source/mechanism (e.g., coaxial illumination sources 718, 818, 828 as shown in FIGS. 7 and 8) may be implemented for the lower branches (e.g., multipath sensory array 702). In some embodiments, the patterning device may be positioned at different distances away from the sensors without requiring assembly adjustments to the sensors. This provides additional benefit with coaxial illumination source 1006 because it would not require any additional illumination/sensor adjustments (as would be the case with external/tilted illumination sources).

In an exemplary embodiment, upon activation of coaxial illumination source 1006, incident beam is projected onto beam splitter 1018, which splits the incident light upwards towards collimating light path 902 and patterning device 516 and downwards towards multipath sensory array 702. Collimating light path 902 initially receives the incident light and projects a collimated image of the light source onto detector 916 as a reference point (e.g., first point). When the incident light is reflected from patterning device 516, a $0^{th}$ order reflected beam is projected back onto beam splitter 912 and is then projected onto collimating light path 902 and multipath sensory array 702.

As previously indicated, the combination of the multipath sensory array 702 along with collimating light path 902 enables pre-alignment system 1000 to perform a variety of measurements necessary for the coordination and transfer of the patterning device. Accordingly, in one embodiment, beam splitter 912 projects a received patterning device image onto collimating light path 902 and multipath sensory array 702. At this point, collimating light path 902 collimates the received image and projects it as a collimated beam (e.g., second point) on to detector 916. Accordingly, sensor 916 then measures a relative tilt of the patterning device by measuring a difference (deviation distance between the first point and the second point. A description of the operation of sensor 916 is further described herein below. As the collimated images are collimated to become a singular projection point, the content of the images is not pertinent to the measurements carried out by detector 916.

As described above, the existing EUV reticle pre-alignment sensor utilizes tilted illumination scheme which may have several disadvantages. For example, multiple LED tilted at an angle design are required to satisfy diffraction requirement imposed by 2D diffraction gratings formed on the elements of alignment mark. The multiple illumination LEDs are mounted with high precision putting undue burden on mechanical design and alignment. Further, since the illuminator tilt angle is specific to the wavelength employed and grating period in the features of the alignment mark, changing illumination wavelength may require mechanical redesign and/or change in feature's diffraction pattern. Additional disadvantages include challenges in mounting additional sets of illuminators for multichannel systems, and difficulties to maintain illumination uniformity.

The pre-alignment sensors described herein replace tilted illumination with built-in coaxial illumination, thus provide for compact design and enhanced accuracy in measurements of patterning device. Such built-in coaxial illumination arrangement can be applied to single-branch, double-branch, or multi-branch pre-alignment sensor system. The placement of one or more coaxial illuminators can be chosen depending on available space mechanical layout, as described above in connection with FIGS. 5-10.

The advantages of the disclosed built-in coaxial illumination schemes include, but not limited to, ease of illuminator mounting and alignment, independence from wavelength of illumination, ease of illuminator replacement, use of single illuminator for two or more branches of multi-channel pre-alignment sensors, improved illumination uniformity, etc. Further, bright field illumination of the disclosed co-axial illumination arrangements can provide better use of dynamic range of the sensor. As such, false features on the patterning device can appear bright, merging with background, and be easier eliminated by image processing. In addition, by replacing tilted illumination with built-in coaxial illumination, removal of the tilted illuminators from the object space (near reticle) can make the space occupied by the tilted illuminators be available for additional sensors like proximity sensors, tilt sensors, and other sensors or their combination.

It is also noted that, in some various embodiments of the present disclosure, different wavelength illuminators can be used in different branches of a multi-channel pre-alignment sensor system for measuring different properties of the patterning device. Different wavelength illuminators can also be used in a single branch of a multi-channel pre-alignment sensor system to enhance reliability.

Specifically, the combination of a coaxial Kohler illumination with a collimating channel functioning as a level detector provides two primary functions of improved illumination techniques while also providing a measuring channel for detecting patterning device tilt. The coaxial Kohler illumination source may be incorporated within the measuring channel for more compact modular design. Moreover, the illumination provided by the Kohler coaxial illumination source may be used as a common light source for a multi-channel system, and provides benefits such as module compactness, even illumination of the sample patterning device, and reduction of image artifacts and high contrast. Moreover, the common source illumination approach simplifies the system design and allows for a modular design of the pre-alignment system. Such modular design may enable the inclusion of additional modular channels to perform other measurements of the patterning device, while maintaining compactness and accuracy.

The embodiments may further be described using the following clauses:

1. A patterning device pre-alignment sensor system, comprising:
    at least one illumination source configured to provide an incident beam along a normal direction towards a patterning device;
    an object lens group channel along the normal direction configured to receive a $0^{th}$ order refracted beam from the patterning device;
    a first light reflector configured to redirect the $0^{th}$ order refracted beam to form a first retroreflected beam; and
    a first image lens group channel configured to transmit the first retroreflected beam to a first light sensor;
    wherein the first light sensor is configured to detect the first retroreflected beam to determine a location feature of the patterning device.

2. The system of clause 1, wherein the at least one illumination source includes a first illumination source arranged close to the first reflector light reflector, and configured to emit the incident beam along the object lens group channel.

3. The system of clause 1, wherein:
    the at least one illumination source includes a first illumination source arranged close to the first image lens group channel; and
    the first image lens group channel includes a first source reflector configured to redirect the incident light emitted from the first illumination source to a direction along first image lens group channel.

4. The system of clause 1, wherein:
    the first light reflector comprises a first beam splitter; and
    the system further comprises:
        a lower object lens group channel configured to receive the $0^{th}$ order refracted beam from the first beam splitter,
        a second light reflector configured to redirect the $0^{th}$ order refracted beam to form a second retroreflected beam, and
        a second image lens group channel configured to transmit the second retroreflected beam to a second light sensor;
    wherein the second light sensor is configured to detect the second retroreflected beam to determine a further location feature of the patterning device.

5. The system of clause 4, wherein:
    the first and second light sensors are configured to detect the first and second retroreflected beams to determine an X-Y planar location feature and a rotation feature of the patterning device.

6. The system of clause 4, wherein:
    the at least one illumination source includes a first illumination source arranged close to the second reflector light reflector, and configured to emit the incident beam along the lower object lens group channel.

7. The system of clause 6, wherein the first illumination source simultaneously illuminates the first and second image lens group channels.

8. The system of clause 6, wherein:
    the at least one illumination source further includes a second illumination source arranged close to the second reflector light reflector, and configured to emit the incident beam along the lower object lens group channel; and
    the first illumination source and the second illumination source produce different wavelengths.

9. The system of clause 4, wherein the at least one illumination source comprises:
    a first illumination source arranged close to the first image lens group channel; and
    a second illumination source arranged close to the second image lens group channel;
    wherein:
        the first image lens group channel includes a first source reflector configured to redirect the incident light emitted from the first illumination source to a first direction along the first image lens group channel, and the second image lens group channel includes a second source reflector configured to redirect the incident light emitted from the second illumination source to a second direction along the second image lens group channel.

10. The system of clause 9, wherein:
the first illumination source and the second illumination source produce different wavelengths.

11. The system of clause 4, further comprising:
a third light reflector configured to redirect the $0^{th}$ order refracted beam to form a third retroreflected beam, and
a third image lens group channel including a collimator configured to focus the third retroreflected beam to a third light sensor;
wherein the third light sensor is configured to detect the focused third retroreflected beam to determine a relative tilt of the patterning device.

12. The system of clause 11, wherein:
the at least one illumination source includes a first illumination source arranged close to the second reflector light reflector, and configured to emit the incident beam along the lower object lens group channel to simultaneously illuminate the first, second and the third image lens group channels.

13. The system of clause 12, wherein the at least one illumination source further includes:
a second illumination source arranged close to the second reflector light reflector, and configured to emit the incident beam along the lower object lens group channel; and
the first illumination source and the second illumination source produce different wavelengths.

14. The system of clause 12, wherein:
the at least one illumination source includes a third light source that generates a collimated beam, the collimated beam illuminates the patterning device;
the third light sensor is configured to measure the relative tilt of the patterning device based on a displacement measurement between a focal point of the third light sensor and a point created by the focused third retroreflected beam.

15. The system of clause 14, wherein the third light source is a coaxial Kohler illumination source configured to provide an even illumination of the patterning device.

16. The system of clause 14, wherein:
the third light source is arranged close to the third image lens group channel;
wherein the third image lens group channel includes a third source reflector configured to redirect the collimated beam emitted from the third illumination source to a third direction along the third image lens group channel;

17. The system of clause 14, wherein:
the third light source is arranged within the object lens group channel.

18. The system of clause 11, wherein the at least one illumination source includes:
a first illumination source arranged adjacent to the first image lens group channel;
a second illumination source arranged adjacent to the second image lens group channel; and
a third illumination source arranged adjacent to the third image lens group channel;
wherein:
the first image lens group channel includes a first source reflector configured to redirect the incident light emitted from the first illumination source to a first direction along the first image lens group channel,
the second image lens group channel includes a second source reflector configured to redirect the incident light emitted from the second illumination source to a second direction along the second image lens group channel, and
the third image lens group channel includes a third source reflector configured to redirect the incident light emitted from the third illumination source to a third direction along the third image lens group channel.

19. A lithographic apparatus, comprising:
a patterning device pre-alignment sensor system, comprising:
at least one illumination source configured to provide an incident beam along a normal direction towards a patterning device;
an object lens group channel along the normal direction configured to receive a $0^{th}$ order refracted beam from the patterning device;
a first light reflector configured to redirect the $0^{th}$ order refracted beam to form a first retroreflected beam; and
a first image lens group channel configured to transmit the first retroreflected beam to a first light sensor;
wherein the first light sensor is configured to detect the first retroreflected beam to determine a location feature of the patterning device.

20. The lithographic apparatus of clause 19, wherein the patterning device pre-alignment sensor system further comprises:
a lower object lens group channel configured to receive the $0^{th}$ order refracted beam from the first light reflector;
a second light reflector configured to redirect the $0^{th}$ order refracted beam to form a second retroreflected beam; and
a second image lens group channel configured to transmit the second retroreflected beam to a second light sensor;
wherein the second light sensor is configured to detect the second retroreflected beam to determine a further location feature of the patterning device.

21. The lithographic apparatus of clause 20, wherein the patterning device pre-alignment sensor system further comprises:
a third light reflector configured to redirect the $0^{th}$ order refracted beam to form a third retroreflected beam; and
a third image lens group channel including a collimator configured to focus the third retroreflected beam to a third light sensor;
wherein the third light sensor is configured to detect the focused third retroreflected beam to determine a relative tilt of the patterning device.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation," "beam," and "light" used herein may encompass all types of electromagnetic radiation, for example, ultraviolet (UV) radiation (for example, having a wavelength $\lambda$ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in some embodiments, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein may describe a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "patterning device," "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A patterning device pre-alignment sensor system, comprising:
   at least one illumination source configured to provide an incident beam along a normal direction towards a patterning device;
   an object lens group channel along the normal direction configured to receive a $0^{th}$ order refracted beam from the patterning device;
   a first light reflector configured to redirect the $0^{th}$ order refracted beam to form a first retroreflected beam; and
   a first image lens group channel configured to transmit the first retroreflected beam to a first light sensor;
   wherein the first light sensor is configured to detect the first retroreflected beam to determine a position, orientation, and/or tilt location feature of the patterning device.

2. The system of claim 1, wherein the at least one illumination source includes a first illumination source arranged close to the first light reflector, and configured to emit the incident beam along the object lens group channel.

3. The system of claim 1, wherein:
the at least one illumination source includes a first illumination source arranged close to the first image lens group channel; and
the first image lens group channel includes a first source reflector configured to redirect the incident beam emitted from the first illumination source to a direction along the first image lens group channel.

4. The system of claim 1, wherein:
the first light reflector comprises a first beam splitter; and
the system further comprises:
 a lower object lens group channel configured to receive the $0^{th}$ order refracted beam from the first beam splitter,
 a second light reflector configured to redirect the $0^{th}$ order refracted beam to form a second retroreflected beam, and
 a second image lens group channel configured to transmit the second retroreflected beam to a second light sensor;
wherein the second light sensor is configured to detect the second retroreflected beam to determine a further location feature of the patterning device.

5. The system of claim 4, wherein:
the first and second light sensors are configured to detect the first and second retroreflected beams to determine an X-Y planar location feature and a rotation feature of the patterning device.

6. The system of claim 4, wherein:
the at least one illumination source includes a first illumination source arranged close to the second light reflector, and configured to emit the incident beam along the lower object lens group channel.

7. The system of claim 6, wherein the first illumination source simultaneously illuminates the first and second image lens group channels.

8. The system of claim 6, wherein:
the at least one illumination source further includes a second illumination source arranged close to the second light reflector, and configured to emit the incident beam along the lower object lens group channel; and
the first illumination source and the second illumination source produce different wavelengths.

9. The system of claim 4, wherein the at least one illumination source comprises:
a first illumination source arranged close to the first image lens group channel; and
a second illumination source arranged close to the second image lens group channel;
wherein:
 the first image lens group channel includes a first source reflector configured to redirect the incident beam emitted from the first illumination source to a first direction along the first image lens group channel, and
 the second image lens group channel includes a second source reflector configured to redirect the incident beam emitted from the second illumination source to a second direction along the second image lens group channel.

10. The system of claim 9, wherein:
the first illumination source and the second illumination source produce different wavelengths.

11. The system of claim 4, further comprising:
a third light reflector configured to redirect the $0^{th}$ order refracted beam to form a third retroreflected beam, and
a third image lens group channel including a collimator configured to focus the third retroreflected beam to a third light sensor;
wherein the third light sensor is configured to detect the focused third retroreflected beam to determine a relative tilt of the patterning device.

12. The system of claim 11, wherein:
the at least one illumination source includes a first illumination source arranged close to the second light reflector, and configured to emit the incident beam along the lower object lens group channel to simultaneously illuminate the first, second and the third image lens group channels.

13. The system of claim 12, wherein the at least one illumination source further includes:
a second illumination source arranged close to the second light reflector, and configured to emit the incident beam along the lower object lens group channel; and
the first illumination source and the second illumination source producing different wavelengths.

14. The system of claim 12, wherein:
the at least one illumination source includes a third illumination source that generates a collimated beam, and wherein the collimated beam illuminates the patterning device;
the third light sensor is configured to measure the relative tilt of the patterning device based on a displacement measurement between a focal point of the third light sensor and a point created by the focused third retroreflected beam.

15. The system of claim 14, wherein the third illumination source is a coaxial Kohler illumination source configured to provide an even illumination of the patterning device.

16. The system of claim 14, wherein:
the third illumination source is arranged close to the third image lens group channel;
wherein the third image lens group channel includes a third source reflector configured to redirect the collimated beam emitted from the third illumination source to a third direction along the third image lens group channel.

17. The system of claim 14, wherein:
the third illumination source is arranged within the object lens group channel.

18. The system of claim 11, wherein the at least one illumination source includes:
a first illumination source arranged adjacent to the first image lens group channel;
a second illumination source arranged adjacent to the second image lens group channel; and
a third illumination source arranged adjacent to the third image lens group channel;
wherein:
 the first image lens group channel includes a first source reflector configured to redirect the incident beam emitted from the first illumination source to a first direction along the first image lens group channel,
 the second image lens group channel includes a second source reflector configured to redirect the incident beam emitted from the second illumination source to a second direction along the second image lens group channel, and
 the third image lens group channel includes a third source reflector configured to redirect the incident beam emitted from the third illumination source to a third direction along the third image lens group channel.

19. A lithographic apparatus, comprising:

a patterning device pre-alignment sensor system, comprising:

at least one illumination source configured to provide an incident beam along a normal direction towards a patterning device;

an object lens group channel along the normal direction configured to receive a $0^{th}$ order refracted beam from the patterning device;

a first light reflector configured to redirect the $0^{th}$ order refracted beam to form a first retroreflected beam; and a first image lens group channel configured to transmit the first retroreflected beam to a first light sensor;

wherein the first light sensor is configured to detect the first retroreflected beam to determine a position, orientation, and/or tilt location feature of the patterning device.

20. The lithographic apparatus of claim 19, wherein the patterning device pre-alignment sensor system further comprises:

a lower object lens group channel configured to receive the $0^{th}$ order refracted beam from the first light reflector;

a second light reflector configured to redirect the $0^{th}$ order refracted beam to form a second retroreflected beam; and a second image lens group channel configured to transmit the second retroreflected beam to a second light sensor;

wherein the second light sensor is configured to detect the second retroreflected beam to determine a further location feature of the patterning device.

* * * * *